United States Patent
Fujiwara et al.

(10) Patent No.: US 10,451,969 B2
(45) Date of Patent: Oct. 22, 2019

(54) RESIN COMPOSITION, METHOD FOR MANUFACTURING SEMICONDUCTOR ELEMENT USING THE SAME, AND SEMICONDUCTOR DEVICE

(71) Applicant: TORAY INDUSTRIES, INC., Tokyo (JP)

(72) Inventors: Takenori Fujiwara, Otsu (JP); Yugo Tanigaki, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/567,822

(22) PCT Filed: Apr. 20, 2016

(86) PCT No.: PCT/JP2016/062530
§ 371 (c)(1),
(2) Date: Oct. 19, 2017

(87) PCT Pub. No.: WO2016/171179
PCT Pub. Date: Oct. 27, 2016

(65) Prior Publication Data
US 2018/0164683 A1    Jun. 14, 2018

(30) Foreign Application Priority Data

Apr. 24, 2015    (JP) .................................. 2015-089040

(51) Int. Cl.
| | | |
|---|---|---|
| *G03F 7/038* | (2006.01) |
| *C08L 79/04* | (2006.01) |
| *C08L 79/08* | (2006.01) |
| *G03F 7/40* | (2006.01) |
| *C08F 212/14* | (2006.01) |
| *C08G 73/10* | (2006.01) |
| *G03F 7/039* | (2006.01) |
| *G03F 7/16* | (2006.01) |
| *G03F 7/20* | (2006.01) |
| *G03F 7/32* | (2006.01) |
| *H01L 21/22* | (2006.01) |
| *H01L 21/308* | (2006.01) |
| *H01L 21/3205* | (2006.01) |
| *G03F 7/004* | (2006.01) |
| *G03F 7/023* | (2006.01) |

(52) U.S. Cl.
CPC .......... *G03F 7/0387* (2013.01); *C08F 212/14* (2013.01); *C08G 73/1071* (2013.01); *C08L 79/04* (2013.01); *C08L 79/08* (2013.01); *G03F 7/0046* (2013.01); *G03F 7/0233* (2013.01); *G03F 7/039* (2013.01); *G03F 7/162* (2013.01); *G03F 7/168* (2013.01); *G03F 7/20* (2013.01); *G03F 7/322* (2013.01); *G03F 7/40* (2013.01); *H01L 21/22* (2013.01); *H01L 21/3081* (2013.01); *H01L 21/3086* (2013.01); *H01L 21/32051* (2013.01)

(58) Field of Classification Search
CPC ............... H01L 21/32051; H01L 21/22; H01L 21/3081; H01L 21/3086; G03F 7/0387; G03F 7/0233; G03F 7/0046; G03F 7/039; G03F 7/162; G03F 7/322; G03F 7/168; G03F 7/20; G03F 7/40; C08G 73/1071; C08F 212/14; C08L 79/04; C08L 79/08
See application file for complete search history.

(56) References Cited

U.S. PATENT DOCUMENTS

| | | | |
|---|---|---|---|
| 5,114,826 A | 5/1992 | Kwong et al. |
| 7,364,978 B2 | 4/2008 | Fujikawa et al. |
| 7,759,211 B2 | 7/2010 | Fujikawa et al. |
| 9,989,854 B2 | 6/2018 | Kume et al. |
| 2005/0032373 A1 | 2/2005 | Cameron et al. |
| 2006/0063342 A1 | 3/2006 | Fujikawa et al. |
| 2011/0284855 A1 | 11/2011 | Miyoshi et al. |
| 2015/0219991 A1 | 8/2015 | Masuda et al. |
| 2017/0299965 A1* | 10/2017 | Hashimoto ........... C08L 101/02 |

FOREIGN PATENT DOCUMENTS

| | | |
|---|---|---|
| CN | 100382246 C | 4/2008 |
| CN | 101241848 A | 8/2008 |
| CN | 102227474 A | 10/2011 |
| CN | 106715597 A | 5/2017 |
| EP | 1619715 A1 | 1/2006 |
| JP | 2006308765 A | 11/2006 |
| JP | 2007056109 A | 3/2007 |
| JP | 2008308572 A | 12/2008 |
| JP | 2014137523 A | 7/2014 |

(Continued)

OTHER PUBLICATIONS

Extended European Search Report for European Application No. 16783200.5, dated Sep. 17, 2018, 10 pages.
International Search Report and Written Opinion for International Application No. PCT/JP2016/062530, dated Jul. 19, 2016—5 Pages.
Chinese Office Action for Chinese Application No. 201680017449. 6, dated Jul. 2, 2019—6 pages.
Taiwanese Office Action for Taiwanese Application No. 10820673980, dated Jul. 16, 2019—3 pages.

*Primary Examiner* — Cynthia Hamilton
(74) *Attorney, Agent, or Firm* — Ratnerprestia

(57) ABSTRACT

Provided is a resin composition including: (A1) an alkali-soluble resin having a specific structural unit; (A2) at least one resin selected from the group consisting of polyimides, polybenzoxazoles, polyamideimides, precursors thereof, and copolymers thereof, the resin having a substituent that reacts with a reactive group of the alkali-soluble resin; and (B) a photosensitizer, in which the amount of the resin (A2) is 310 to 2,000 parts by weight with respect to 100 parts by weight of the resin (A1).

14 Claims, No Drawings

(56) References Cited

FOREIGN PATENT DOCUMENTS

| | | |
|---|---|---|
| TW | 200506516 A | 2/2005 |
| WO | 2004097914 A1 | 11/2004 |
| WO | 2010087238 A1 | 8/2010 |
| WO | 2014045434 A1 | 3/2014 |
| WO | 2015012272 A1 | 1/2015 |
| WO | WO-2016056451 A1 * | 4/2016 ............ C08L 101/02 |

* cited by examiner

RESIN COMPOSITION, METHOD FOR MANUFACTURING SEMICONDUCTOR ELEMENT USING THE SAME, AND SEMICONDUCTOR DEVICE

CROSS REFERENCE TO RELATED APPLICATIONS

This is the U.S. National Phase application of PCT/JP2016/062530, filed Apr. 20, 2016, which claims priority to Japanese Patent Application No. 2015-089040, filed Apr. 24, 2015.

TECHNICAL FIELD OF THE INVENTION

The present invention relates to a resin composition, a method for manufacturing a semiconductor element using the same, and a semiconductor device.

BACKGROUND OF THE INVENTION

In a process for manufacturing semiconductor devices, resists such as photoresists are typically used to form an ion impurity region in a semiconductor substrate. For example, a resist film formed on a semiconductor substrate is irradiated with an active chemical ray through a mask or a reticle having a desired pattern, then developed with a developing solution, and then heated to be cured (hereinafter, referred to as "heat curing"), whereby a cured pattern of the resist film is formed. By using the formed cured pattern as an ion implantation mask or a dopant exposure mask, an element that will constitute an ion impurity region from a compound containing the element is ionized. Then, a collision of the resulting ions with the semiconductor substrate is caused (hereinafter, referred to as "ion implantation"), or the semiconductor substrate is exposed to a compound containing an element that will constitute an ion impurity region (hereinafter, referred to as "dopant exposure"). In this manner, an ion impurity region having a desired pattern is formed.

In the case where an ion impurity region is formed in a semiconductor substrate by ion implantation or dopant exposure, an ion implantation mask and a dopant exposure mask are required to be designed with high-resolution pattern processability for the purpose of forming an ion impurity region having a desired pattern. Furthermore, to form an ion impurity region having a desired pattern dimension, an ion implantation mask and a dopant exposure mask are required to be designed with rectangular pattern processability. Furthermore, an ion implantation mask and a dopant exposure mask are required to be designed with high heat resistance and cracking resistance. In particular, at the time of ion implantation, ions accelerated with high energy collide with a semiconductor substrate, so that excess heat is generated by collision energy, and hence, an ion implantation mask is required to be designed with high heat resistance and high cracking resistance so as to be capable of resisting the impact of ion implantation.

In recent years, it has been desired that, not only in ion implantation, but also in substrate processing by dry etching or ion milling, a simpler cooling system is employed to accelerate processing speed, and accordingly, a photoresist having high heat resistance has been desired.

Note that a polyimide is a resin excellent in heat resistance, and can be patterned when provided with photosensitivity. Techniques using a polyimide-based photosensitive composition as an insulating film or an ion implantation mask for semiconductor devices have been disclosed (for example, refer to Patent Literatures 1 to 3).

CITATION LIST

Patent Literature

Patent Literature 1: U.S. Pat. No. 5,114,826
Patent Literature 2: WO 2004/97914
Patent Literature 3: Japanese Patent Application Laid-open No. 2014-137523

SUMMARY OF THE INVENTION

However, a technique described in Patent Literature 1 has a problem in that, due to pattern reflow or curing shrinkage at high temperature processing at 150° C. or higher, a rectangular pattern cannot be formed, resulting in lower resolution.

A technique described in Patent Literature 2 has a problem in that, with this technique, a high-temperature processed film of negative polyimide is difficult to peel, and thus, a complicated process is required in which a silicon dioxide thin film or a metal thin film is formed under a polyimide layer and peeled by lift-off. Furthermore, there is a problem in that this technique results in insufficient resolution.

A technique described in Patent Literature 3 has a problem in that this technique provides high resolution, but provides an insulating protective film, which is insoluble in a resist peeling liquid, and hence, the film is not suitable as a photoresist or an ion implantation mask.

An object of the present invention is to provide a resin composition that solves the above-mentioned problems associated with the prior arts, allows high resolution and a pattern form to be maintained even after high temperature processing, and is applicable as a photoresist that can be peeled off after processing.

A resin composition according to an embodiment of the present invention includes: (A1) an alkali-soluble resin having a structural unit represented by general formula (1); (A2) at least one resin selected from the group consisting of polyimides, polybenzoxazoles, polyamideimides, precursors thereof, and copolymers thereof, the resin having a substituent that reacts with a reactive group of the alkali-soluble resin; and (B) a photosensitizer. An amount of the resin (A2) is 310 to 2,000 parts by weight with respect to 100 parts by weight of the resin (A1).

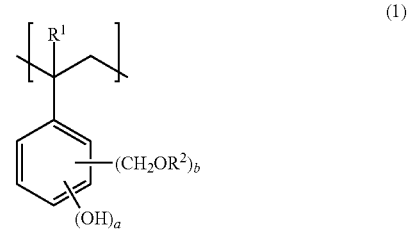

(1)

In the formula (1), $R^1$ is a hydrogen atom or a $C_{1-5}$ alkyl group; $R^2$ is a hydrogen atom or a $C_{1-6}$ alkyl group; a is an integer of 0 to 4; b is an integer of 1 to 3; and a+b is an integer of 1 to 5.

The present invention provides a resin composition that allows high resolution and a pattern form to be maintained even after high temperature processing and is applicable as a photoresist that can be peeled off after processing.

DETAILED DESCRIPTION OF EMBODIMENTS OF THE INVENTION

A resin composition according to an embodiment of the present invention includes: (A1) an alkali-soluble resin having a structural unit represented by the general formula (1); (A2) at least one resin selected from the group consisting of polyimides, polybenzoxazoles, polyamideimides, precursors thereof, and copolymers thereof, the resin having a substituent that reacts with a reactive group of the alkali-soluble resin; and (B) a photosensitizer, wherein an amount of the resin (A2) is 310 to 2,000 parts by weight with respect to 100 parts by weight of the resin (A1).

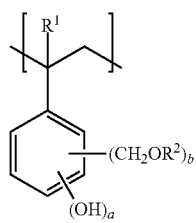

(1)

In the formula (1), $R^1$ is a hydrogen atom or a $C_{1-5}$ alkyl group; $R^2$ is a hydrogen atom or a $C_{1-6}$ alkyl group; a is an integer of 0 to 4; b is an integer of 1 to 3; and a+b is an integer of 1 to 5.

Resin (A1)

The resin composition according to the present invention includes (A1) an alkali-soluble resin having a structural unit represented by the general formula (1).

In the present invention, the term "alkali-soluble" means that 0.1 g of the resin (A1) can be completely dissolved in 100 g of 2.38% tetramethylammonium hydroxide aqueous solution at 23° C.

In the general formula (1), $R^1$ is preferably a hydrogen atom. Furthermore, $R^2$ is preferably a hydrogen atom, a methyl group, an ethyl group, or a propyl group, and particularly preferably a hydrogen atom or a methyl group.

The resin (A1) can be obtained, for example, by an addition reaction between an aldehyde group and a part of a polymer by a well-known method, the polymer being obtained by polymerizing one, or two or more kinds of aromatic vinyl compounds having a phenolic hydroxy group, such as p-hydroxystyrene, m-hydroxystyrene, o-hydroxystyrene, p-isopropenylphenol, m-isopropenylphenol, and o-isopropenylphenol, or aromatic vinyl compounds, such as styrene, o-methylstyrene, m-methylstyrene, and p-methylstyrene, by a well-known method. Furthermore, subsequently, the resin may be allowed to react with a desired alcohol under acidic conditions, so that the methylol terminal may be alkoxylated.

As the aromatic vinyl compounds having a phenolic hydroxy group, at least one of p-hydroxystyrene and m-hydroxystyrene is preferably used. As the aromatic vinyl compound, styrene is preferably used.

The resin (A1) is preferably a polymer including structural units represented by the general formulae (2), (3), and (4).

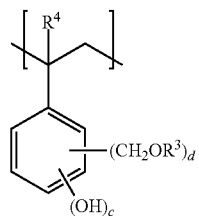

(2)

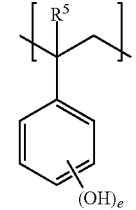

(3)

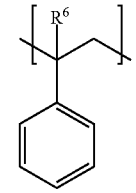

(4)

In the formula (2), $R^4$ is a hydrogen atom or a $C_{1-5}$ alkyl group; and $R^3$ is a hydrogen atom, a methyl group, an ethyl group, or a propyl group. Furthermore, c is an integer of 1 to 4; d is an integer of 1 to 3; and c+d is an integer of 2 to 5.

In the formula (3), $R^5$ is a hydrogen atom or a $C_{1-5}$ alkyl group; and e is an integer of 1 to 5.

In the formula (4), $R^6$ is a hydrogen atom or a $C_{1-5}$ alkyl group.

$R^3$ to $R^6$ are each preferably a hydrogen atom.

The average molecular weight (Mw) of the resin (A1) in terms of polystyrene is preferably in a range of 3,000 to 60,000, more preferably in a range of 3,000 to 25,000. When the average molecular weight is in this range, an optimum alkali solubility and particularly a pattern with high resolution can be achieved.

Resin (A2)

The resin composition according to an embodiment of the present invention includes (A2) an alkali-soluble resin selected from the group consisting of polyimides, polybenzoxazoles, polyamideimides, precursors thereof, and copolymers thereof, the resin having a substituent that reacts with a reactive group of the resin (A1).

The resin (A2) may be a mixture of two or more of the above-mentioned components, or may be a copolymer having the repeating units of two or more of these components.

The reactive group of the resin (A1) denotes an alkoxy methyl group or a methylol group, and, as long as the resin (A2) has a substituent that reacts with an alkoxy methyl group or a methylol group, the structure of the resin (A2) is not limited to a particular structure. Examples of the substituent that reacts with an alkoxy methyl group or a methylol group include carboxy group, phenolic hydroxy group, sulfonic acid group, and thiol group.

The resin (A2) preferably has, in a main chain thereof or at a terminal thereof, at least one group selected from the group consisting of carboxy group, phenolic hydroxy group, sulfonic acid group, and thiol group.

The resin (A2) can be obtained, for example, as a precursor obtained by reacting a dicarboxylic acid, a tetracarboxylic acid, the corresponding dichloride dicarboxylate, tetracarboxylic dianhydride, and tetracarboxylic diesterdichloride, or the like with a diamine, or the corresponding diisocyanate compound or trimethylsilylated diamine; or by dehydrating and ring-closing a precursor by heating or by chemical treatment with an acid or a base.

In the case of using a polyimide, a polybenzoxazole, or a polyamideimide, the ring closure rate is preferably 50% or higher, more preferably 70% or higher, and still more preferably 85% or higher. The ring closure rate can be determined in such a manner that a resin (A2) is applied onto a silicon wafer, peak intensities around 1377 cm$^{-1}$ before and after curing are compared using infrared absorption spectrum and the imidization ratio is calculated.

Resin (A2) preferably has at least one of a hexafluoro propylene structure and a propylene structure illustrated below.

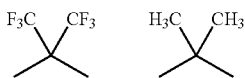

When at least one of a diamine residue and an acid dianhydride residue have at least one of the hexafluoro propylene structure and the propylene structure, these structures can be introduced into the resin (A2). Diamine residues and acid dianhydride residues having at least one of the hexafluoro propylene structure and the propylene structure account for preferably 20 mol % or higher, more preferably 30 mol % or higher of all diamine residues and all acid dianhydride residues. This allows solubility after high temperature processing to be further enhanced. As for the upper limit, diamine residues and acid dianhydride residues having at least one of the hexafluoro propylene structure and the propylene structure account for preferably 80 mol % or lower, more preferably 60 mol % or lower of all diamine residues and all acid dianhydride residues. This allows heat resistance to be further enhanced.

Examples of diamine and acid dianhydride having at least one of the hexafluoro propylene structure and the propylene structure include, but are not limited to, polyoxypropylene diamine bis(3-amino-4-hydroxyphenyl) hexafluoropropane, bis(3-amino-4-hydroxyphenyl)propane, 2,2'-hexafluoropropylidene diphthalic dianhydride, and 2,2-bis[4-(3,4-dicarboxyphenoxy)phenyl] propane dianhydride.

The resin (A2) preferably has at least one of a polyethylene oxide structure and a polypropylene oxide structure. The polyethylene oxide structure and the polypropylene oxide structure are preferably represented by the following general formula (5).

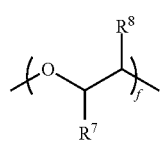

(5)

In the formula (5), R$^7$ and R$^8$ are each hydrogen or a methyl group; and f is an integer of 2 or more. Preferably, f is an integer of 2 to 15.

When at least one of a diamine residue and an acid dianhydride residue have at least one of the polyethylene oxide structure and the polypropylene oxide structure, these structures can be introduced into the resin (A2).

In particular, a diamine residue preferably has the polyethylene oxide structure or the polypropylene oxide structure. Here, diamine residues having the polyethylene oxide structure or the polypropylene oxide structure account for preferably 10 mol % or higher, more preferably 20 mol % or higher of all diamine residues. This allows solubility after high temperature processing to be enhanced. As for the upper limit, diamine residues having the polyethylene oxide structure or the polypropylene oxide structure account for preferably 50 mol % or lower, more preferably 40 mol % or lower of all diamine residues. This allows heat resistance to be further enhanced.

Examples of the diamine having a polyethylene oxide group include, but are not limited to, JEFFAMINE KH-511, JEFFAMINE ED-600, JEFFAMINE ED-900, JEFFAMINE ED-2003, JEFFAMINE EDR-148, and JEFFAMINE EDR-176 (trade names, manufactured by HUNTSMAN Corporation). Examples of the diamine having a polypropylene oxide group include, but are not limited to, D-200, D-400, D-2000, and D-4000 (trade names, manufactured by HUNTSMAN Corporation).

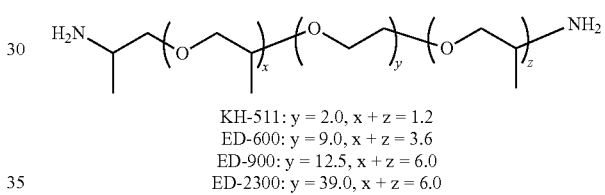

KH-511: y = 2.0, x + z = 1.2
ED-600: y = 9.0, x + z = 3.6
ED-900: y = 12.5, x + z = 6.0
ED-2300: y = 39.0, x + z = 6.0

Examples of diamines constituting other diamine residues in resin (A2) include:

hydroxy group-containing diamines, such as bis(3-amino-4-hydroxyphenyl)sulfone, bis(3-amino-4-hydroxyphenyl)methylene, bis(3-amino-4-hydroxyphenyl)ether, bis(3-amino-4-hydroxy)biphenyl, and bis(3-amino-4-hydroxyphenyl)fluorene;

sulfonic acid-containing diamines, such as 3-sulfonic acid-4,4'-diaminodiphenyl ether, thiol group-containing diamines, such as dimercapto phenylenediamine;

aromatic diamines, such as 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy) benzene, benzine, m-phenylenediamine, p-phenylenediamine, 1,5-naphthalenediamine, 2,6-naphthalenediamine, bis(4-aminophenoxyphenyl) sulfone, bis(3-aminophenoxyphenyl) sulfone, bis(4-aminophenoxy) biphenyl, bis{4-(4-aminophenoxy)phenyl} ether, 1,4-bis(4-aminophenoxy) benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-4,4'-diaminobiphenyl, and compounds obtained by substituting a part of hydrogen atoms of these aromatic rings with, for example, a C$_{1-10}$ alkyl or fluoroalkyl group or a halogen atom; and alicyclic diamines, such as cyclohexanediamine and methylenebiscyclohexylamine.

These diamines may be used as they are, or may be used as the corresponding diisocyanate compounds or trimethylsilylated diamines. Furthermore, two or more of these diamine components may be used in combination. For heat resistance, the amount of aromatic diamines to be used is preferably 50 mol % or higher of all diamines.

The structural unit of the resin (A2) preferably includes a fluorine atom. The presence of a fluorine atom provides water repellency to the surface of a film during alkali development, and can prevent a developing solution from penetrating from the surface. For the purpose of achieving a sufficient effect of preventing the penetration of a developing solution at the surface or a substrate interface, the fluorine atom content of the resin (A2) is preferably 10% by weight or more, and, in terms of solubility in alkaline solutions, the fluorine atom content is preferably 20% by weight or less.

Alternatively, copolymerization with an aliphatic group having a siloxane structure may be performed within the bounds of not deteriorating heat resistance. This copolymerization allows adhesion to a substrate to be enhanced. Specific examples of such a copolymer include those obtained by copolymerization with 1 to 15 mol % of bis(3-aminopropyl)tetramethyldisiloxane, bis(p-aminophenyl)octamethylpentasiloxane, or the like, as a diamine component.

Examples of acid dianhydrides constituting other acid dianhydride residues in the resin (A2) include pyromellitic dianhydride, 4,4'-oxydiphthalic anhydride, 3,3',4,4'-benzophenonetetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, 1,1-bis(2,3-dicarboxyphenyl)ethane dianhydride, 2,2-bis(2,3-dicarboxyphenyl)ethane dianhydride, 2,2-bis(3,3-carboxyphenyl)ethane dianhydride, 3,3',4,4'-biphenylethertetracarboxylic dianhydride, 2,3,3',4'-biphenylethertetracarboxylic dianhydride, 2,3,5,6-pyridinetetracarboxylic dianhydride, pyromellitic dianhydride, 3,4,9,10-perylenetetracarboxylic dianhydride, 2,3,3',4'-benzophenonetetracarboxylic dianhydride, and 3,3',4,4'-benzophenonetetracarboxylic dianhydride. Two or more of these may be used in combination.

Furthermore, to enhance the storage stability of the resin composition, the terminal of the main chain of the resin (A2) is preferably blocked using a terminal blocking agent, such as monoamine, acid anhydride, monocarboxylic acid, a mono acid chloride compound, or a mono active ester compound. The introduction amount of monoamine used as a terminal blocking agent is preferably 0.1 mol % or more, particularly preferably 5 mol % or more, and preferably 60 mol % or less, particularly preferably 50 mol % or less, with respect to all amine components. The introduction amount of acid anhydride, monocarboxylic acid, a mono acid chloride compound, or a mono active ester compound, each being used as a terminal blocking agent, is preferably 0.1 mol % or more, particularly preferably 5 mol % or more, and preferably 100 mol % or less, particularly preferably 90 mol % or less, with respect to diamine components. By reaction with a plurality of terminal blocking agents, different terminal groups may be introduced.

Preferred examples of the monoamine include M-600, M-1000, M-2005, and M-2070 (trade names, manufactured by HUNTSMAN Corporation), aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these may be used in combination. Among these, M-600, M-1000, M-2005, and M-2070 are preferably used because they have a polyethylene oxide group, thereby being excellent in solubility.

Preferred examples of the acid anhydride, the monocarboxylic acid, the mono acid chloride compound, and the mono active ester compound include acid anhydrides, such as phthalic anhydride, maleic anhydride, nadic anhydride, cyclohexanedicarboxylic anhydride, and 3-hydroxyphthalic anhydride; monocarboxylic acids, such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, and mono acid chloride compounds obtained by acid-chlorination of the carboxy groups of these mono carboxyl acids; mono acid chloride compounds obtained by acid-chlorination of the mono carboxy groups at only one end of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene; and active ester compounds obtained by reaction between such a mono acid chloride compound and N-hydroxybenzotriazole or N-hydroxy-5-norbornene-2,3-dicarboxyimide. Two or more of these may be used in combination.

The terminal blocking agent introduced into the resin (A2) can be easily detected in the following manner. For example, the resin into which the terminal blocking agent has been introduced is dissolved in an acidic solution to be decomposed into the structure units of the resin, namely, amine components and acid anhydride components. Subsequently, the components are subjected to gas chromatography (GC) or NMR measurements to easily detect the terminal blocking agent used in the present invention. Alternatively, the terminal blocking agent can be easily detected by directly measuring the resin component into which the terminal blocking agent has been introduced, by pyrolysis gas chromatography (PGC), infrared spectra, and $^{13}$C-NMR spectra.

The resin (A2) preferably has a weight-average molecular weight of 5,000 or more and 40,000 or less. When the weight-average molecular weight measured by GPC (gel permeation chromatography) is 5,000 or more in terms of polystyrene, cracking after development can be reduced. By contrast, when the weight-average molecular weight is 40,000 or less, developability with an alkaline solution can be enhanced. To achieve heat resistance properties, the weight-average molecular weight is more preferably 10,000 or more. In the case where the resin (A2) include two or more of resins, it is only required that the weight-average molecular weight of at least one of the resins is in the above-mentioned range.

Resin (A1) and (A2) Content

In the resin composition according to an embodiment of the present invention, the amount of resin (A2) is 310 to 2000 parts by weight with respect to 100 parts by weight of the resin (A1). The resin (A2) content is more preferably 350 parts by weight or more, still more preferably 375 parts by weight or more, particularly preferably 400 parts by weight or more, with respect to 100 parts by weight of the resin (A1). Furthermore, the resin (A2) content is more preferably 1,750 parts by weight or less, still more preferably 1,500 parts by weight or less, particularly preferably 1,000 parts by weight or less, with respect to 100 parts by weight of the resin (A1). When the resin (A2) content is in this range, high resolution and heat resistance are achieved, and furthermore, the resin composition has solubility in resist peeling liquids.

(B) Photosensitizer

The resin composition according to an embodiment of the present invention includes (B) a photosensitizer. The photosensitizer (B) may be a negative photosensitizer which is photocurable, or may be a positive photosensitizer which is photosoluble. As the photosensitizer (B), for example, (b-1) a polymerizable unsaturated compound and a photopolymerization initiator, or (b-2) a quinone diazide compound is preferably employed.

Examples of the polymerizable unsaturated group of the polymerizable unsaturated compound of the (b-1) include unsaturated functional groups having a double bond, such as vinyl groups, allyl groups, acryloyl groups, and methacryloyl groups; and/or unsaturated functional groups having a triple bond, such as propargyl groups. Among these groups, conjugated vinyl, acryloyl, and methacryloyl groups are preferable in terms of polymerizability. The number of the functional groups contained is preferably 1 to 6 in terms of stability, and the functional groups contained may not be of the same type.

A polymerizable unsaturated compound having a molecular weight of 30 to 2,000 is preferably employed. A polymerizable unsaturated compound having a molecular weight of 30 to 2,000 has a good compatibility with a polymer and a reactive diluent. Specific examples of the polymerizable unsaturated compound include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, styrene, α-methylstyrene, 1,2-dihydronaphthalene, 1,3-diisopropenylbenzene, 3-methylstyrene, 4-methylstyrene, 2-vinylnaphthalene, butyl acrylate, butyl methacrylate, isobutyl acrylate, hexyl acrylate, isooctyl acrylate, isobornyl acrylate, isobornyl methacrylate, cyclohexyl methacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol dimethacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, 2-hydroxyethyl acrylate, 2-hydroxyethyl methacrylate, ethoxylated pentaerythritol tetraacrylate, ethoxylated glycerol triacrylate, 1,3-diacryloyloxy-2-hydroxypropane, 1,3-dimethacryloyloxy-2-hydroxypropane, methylenebisacrylamide, N,N-dimethyl acrylamide, N-methylol acrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, N-vinyl pyrrolidone, and N-vinyl caprolactam. These compounds may be used alone or in combination of two or more thereof.

Among these, particularly preferred examples include 1,9-nonanediol dimethacrylate, 1,10-decanediol dimethacrylate, dimethylol-tricyclodecane diacrylate, isobornyl acrylate, isobornyl methacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, ethoxylated pentaerythritol tetraacrylate, ethoxylated glycerol triacrylate, methylenebisacrylamide, N,N-dimethyl acrylamide, N-methylol acrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, N-vinyl pyrrolidone, and N-vinyl caprolactam.

The photopolymerization initiator of the (b-1) is one that generates mainly radicals by irradiation with light in the range of ultraviolet to visible light and thereby initiates the polymerization of a polymerizable unsaturated compound. The photopolymerization initiator is preferably selected from acetophenone derivatives, benzophenone derivatives, benzoin ether derivatives, and xanthone derivatives because these derivatives allow the use of general-purpose light sources and have fast curability. Preferred examples of the photopolymerization initiator include, but are not limited to, diethoxyacetophenone, 2-hydroxy-2-methyl-1-phenylpropane-1-one, 2,2-dimethoxy-2-phenylacetophenone, 1-hydroxy-cyclohexylphenylketone, isobutyl benzoin ether, benzoin methyl ether, thioxanthone, isopropyl thioxanthone, 2-methyl-1-[4-(methylthio)phenyl]-2-morpholinopropan-1-one, and 2-benzyl-2-dimethylamino-1-(4-morpholinophenyl)-butanone-1.

Examples of the quinone diazide compound (b-2) include compounds in which quinone diazide sulfonic acid is ester-bonded to a polyhydroxy compound; compounds in which quinone diazide sulfonic acid is sulfonamide-bonded to a polyamino compound; and compounds in which quinone diazide sulfonic acid is ester-bonded and/or sulfonamide-bonded to a polyhydroxypolyamino compound. It is not necessary that all the functional groups of these polyhydroxy compounds, polyamino compounds, and polyhydroxypolyamino compounds are substituted with quinone diazide, but, an average of 40 mol % or more of all the functional groups are preferably substituted with quinone diazide. The use of such quinone diazide compounds allows the achievement of positive photosensitive resin compositions that are photosensitive to i line (with a wavelength of 365 nm), h line (with a wavelength of 405 nm), and g line (with a wavelength of 436 nm) of mercury-vapor lamps, which are typical ultraviolet light.

Examples of the polyhydroxy compounds include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP, and Ph-cc-AP (trade names, manufactured by Honshu Chemical Industry Co., Ltd.); BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (trade names, manufactured by ASAHI YUKIZAI CORPORATION); 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylene bisphenol, BisP-AP (trade name, manufactured by Honshu Chemical Industry Co., Ltd.), and novolac resins.

Examples of the polyamino compounds include, but are not limited to, 1,4-phenylenediamine, 1,3-phenylenediamine, 4,4'-diaminodiphenyl ether, 4,4'-diaminodiphenylmethane, 4,4'-diaminodiphenyl sulfone, and 4,4'-diaminodiphenyl sulfide.

Examples of the polyhydroxypolyamino compound include, but are not limited to, 2,2-bis(3-amino-4-hydroxyphenyl) hexafluoropropane and 3,3'-dihydroxybenzidine.

In particular, the quinone diazide compound (b-2) more preferably includes an ester of a phenolic compound and a 5-naphthoquinone diazide sulfonyl group. This allows the achievement of higher sensitivity to i-line exposure and higher resolution.

The quinone diazide compound (b-2) content is preferably 1 to 50 parts by weight, more preferably 10 to 40 parts by weight with respect to 100 parts by weight of the resin (A1). When the quinone diazide compound content is in this range, higher sensitivity can be achieved. Furthermore, for example, a sensitizer may be added as necessary.

(d) Thermally Crosslinkable Compound

Besides the resin (A1), the resin composition according to the present invention may further include (d) a thermally crosslinkable compound, as necessary. Specifically, the resin (A1) preferably includes a compound having at least two alkoxy methyl or methylol groups. Such compound having at least two alkoxy methyl or methylol groups can cause a condensation reaction with resin and the same type of molecule to form a crosslinked structure.

Preferred examples of such compound include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (trade names, manufactured by Honshu Chemical Industry Co., Ltd.); and NIKALAC (registered trademark) MX-290, NIKALAC MX-280, NIKALAC MX-270, NIKALAC MX-279, NIKALAC MW-100LM, and NIKALAC MX-750LM (trade names, manufactured by SANWA Chemical Co., Ltd.). Two or more of these may be included. Among these, HMOM-TPHAP and MW-100LM are more preferably employed because they lead to the less frequent occurrence of pattern embedment due to pattern reflow during curing, thereby enhancing the resolution.

The content of the compound having at least two alkoxy methyl or methylol groups is preferably 10 parts by weight or less with respect to 100 parts by weight of the resin (A2). When the content is in this range, wide range of designs can be more appropriately made to improve sensitivity and the mechanical properties of a cured film.

(Other Components)

The resin composition according to the present invention may optionally include a low molecular weight compound having a phenolic hydroxy group as necessary within the bounds of not decreasing the shrinkage residual film rate after curing. This allows a reduction in developing time.

Examples of such a compound include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, and BisRS-26X (trade names, manufactured by Honshu Chemical Industry Co., Ltd.); and BIP-PC, BIR-PC, BIR-PTBP, and BIR-BIPC-F (trade names, manufactured by ASAHI YUKIZAI CORPORATION). Two or more of these may be included.

The content of the low molecular weight compound having a phenolic hydroxy group is preferably 1 to 40 parts by weight with respect to 100 parts by weight of the resin (A1).

For the purpose of improving wettability onto substrates, the resin composition according to the present invention may include surfactants, esters such as ethyl lactate and propylene glycol monomethyl ether acetate, alcohols such as ethanol, ketones such as cyclohexanone and methyl isobutyl ketone, and ethers such as tetrahydrofuran and dioxane, as necessary.

The resin composition according to the present invention may include a solvent. This allows the resin composition to be in the form of varnish, thereby improving coatability.

Examples of the solvent include:

polar aprotic solvent, such as gamma butyrolactone;

ethers, such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran, and dioxane;

ketones, such as acetone, methyl ethyl ketone, diisobutyl ketone, cyclohexanone, 2-heptanone, 3-heptanone, and diacetone alcohol;

esters, such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, and ethyl lactate;

other esters, such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxypropionate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butylate, n-propyl butylate, i-propyl butylate, n-butyl butylate, methyl pyruvate, ethyl pyruvate, n-propyl pyruvate, methyl acetoacetate, ethyl acetoacetate, and ethyl 2-oxobutanoate;

aromatic hydrocarbons, such as toluene and xylene; and amides, such as N-methylpyrrolidone, N,N-dimethylformamide, and N,N-dimethylacetamide.

These solvents may be used alone, or a mixture thereof may be used. Among these, gamma butyrolactone is preferably employed because it allows other components to be satisfactorily dissolved therein and allows a coating with good surface smoothness to be formed.

The solvent content is not particularly limited because it changes depending on a required film thickness or an adopted application method, but the solvent content is preferably 50 to 2,000 parts by weight, more preferably 100 to 1,500 parts by weight with respect to 100 parts by weight of the resin (A1).

The resin composition according to the present invention is preferably used as a photoresist for, for example, dry etching, ion milling, or ion implantation processing.

The resin composition according to the present invention is preferably soluble in a solution having a weight ratio of dimethyl-sulfoxide/monoethanolamine=3/7 after the resin composition is heat-treated at 250° C. for 1 hour. This is because such resin composition can be peeled off by a common resist peeling liquid even when exposed to a high temperature of 150° C. or higher.

In the present invention, solubility in a solution having a weight ratio of dimethyl-sulfoxide/monoethanolamine=3/7 denotes that, after heat-treated at 250° C. for 1 hour, 1 part by weight of the resin composition according to the present invention is soluble at 80° C. in 100 parts by weight of a solution having a weight ratio of dimethylsulfoxide to monoethanolamine of 3:7 to such an extent that no residue after dissolution is visually observed.

Examples of the peeling liquid include, but are not limited to, peeling liquid 104 and peeling liquid 106 (manufactured by TOKYO OHKA KOGYO CO., LTD.); EKC100 series, EKC270, EKC2255, and EKC2300 (registered trademark, manufactured by E. I. du Pont de Nemours and Company); and N-322, N-306, N-327, N-339, N-342, N-300, N-530, and N-530HS (manufactured by Nagase ChemteX Corporation).

Although depending on a temperature condition to which the resin film according to the present invention is exposed, a preferred condition for treatment with the peeling liquid is 20 to 120° C. The reason why the temperature condition of 20 to 120° C. is preferable that such temperature allows peeling to be performed without leaving a resist residue and without causing damage to a substrate surface. Although not limited to, treatment time is preferably 1 to 20 minutes from the viewpoint of production takt time. A process, such as dipping, showering, or ultrasonic assistance, can be made use of to dissolve a resist.

In the case where the resin composition according to the present invention is used in a process at 150° C. or higher, curing temperature is preferably 150° C. or higher and 300° C. or lower. The curing temperature of 150° C. or higher leads to a reduction in the occurrence of outgassing from a resin film and explosive tearing thereof during the process. The curing temperature of 300° C. or lower allows solubility in a resist peeling liquid to be ensured.

From the viewpoint of easy removal of a resist, the resin composition according to the present invention is preferably exposed to a high temperature of 400° C. or higher, preferably 500° C. or higher, more preferably 600° C. or higher so that organic substances are thermally decomposed before resist removal. Furthermore, in the case of the exposure to a high temperature, the exposure is performed in the presence of oxygen.

(Method for Manufacturing Semiconductor Element)

A method for manufacturing a semiconductor element according to an embodiment of the present invention includes the steps of: (1) forming a pattern of the resin composition according to the present invention on a substrate; (2) performing, at 150° C. or higher, at least one step selected from the group consisting of (a) doping the substrate with impurity ions, (b) etching the substrate, and (c) dry-forming a film on the substrate; and (3) peeling off the pattern.

As a method of applying the resin composition according to the present invention, the step (a) is preferably (a-1) ion implantation into the substrate, or (a-2) exposure of the substrate having the patterned resin film formed thereon to a dopant.

As a method of applying the resin composition according to the present invention, the step (b) is preferably (b-1) patterning the substrate by dry etching, or (b-2) patterning the substrate by wet etching.

As a method of applying the resin composition according to the present invention, the step (c) is preferably dry-forming a metal film on the substrate.

In the step of forming a metal film, the metal is preferably aluminum, gold, copper, tungsten, titanium, silver, molybdenum, or chromium.

The advantage that a process using the resin composition according to the present invention is simplified is brought about, when, as the substrate to be etched by dry etching or ion milling or the substrate to be doped with impurity ions, use is made of a substrate including at least one selected from the group consisting of silicon, silicon dioxide ($SiO_2$), silicon nitride ($Si_3N_4$), silicon carbide (SiC), gallium nitride (GaN), gallium phosphide (GaP), gallium arsenide (GaAs), aluminum gallium arsenide (GaAlAs), gallium indium nitrogen arsenic (GaInNAs), indium nitride (InN), indium phosphide (InP), indium tin oxide (ITO), indium zinc oxide (IZO), indium gallium arsenide (InGaAs), indium gallium aluminum phosphide (InGaAlP), indium gallium zinc oxide (IGZO), diamond, sapphire ($Al_2O_3$), aluminum zinc oxide (AZO), aluminum nitride (AlN), zinc oxide (ZnO), zinc selenide (ZnSe), cadmium sulfide (CdS), cadmium telluride (CdTe), aluminum (Al), and gold (Au). Furthermore, silicon, silicon carbide (SiC), gallium nitride (GaN), gallium arsenide (GaAs), diamond, sapphire ($Al_2O_3$), aluminum (Al), and gold (Au) are preferable because they require high temperature treatment.

(Step of Doping Substrate with Impurity Ions)

Using a pattern formed from the resin composition according to the present invention as an ion implantation mask, ions are implanted into a substrate having the pattern formed thereon, so that a patterned ion impurity region can be formed in the substrate.

The step of ion doping is such that, using the resin film pattern according to the present invention as an ion doping mask, a substrate having the pattern formed thereon is doped with ions, so that a patterned ion impurity region can be formed in the substrate.

In the method for manufacturing a semiconductor element according to an embodiment of the present invention, the ion doping step is a step of forming an ion impurity region in a substrate. Hereinafter, a compound that is to be used at the ion doping step and contains an element to form an ion impurity region will be referred to as "dopant substance".

Examples of the ion doping step include an ion implantation step and a dopant exposure step. The ion implantation step is a step of, from a compound containing an element to form an ion impurity region, ionizing the element and causing the resulting ions to collide with a semiconductor substrate. The dopant exposure step is a step of exposing a semiconductor substrate to a compound containing an element to form an ion impurity region.

In the method for manufacturing a semiconductor element according to the present invention, examples of the element that is used at the ion doping step to form an ion impurity region include boron, aluminum, gallium, indium, nitrogen, phosphorus, arsenic, antimony, carbon, silicon, germanium, tin, oxygen, sulfur, selenium, tellurium, fluorine, chlorine, bromine, iodine, cadmium, zinc, titanium, tungsten, and iron. From the viewpoint of the formation of an ion impurity region, use is preferably made of boron, aluminum, gallium, indium, nitrogen, phosphorus, arsenic, antimony, carbon, silicon, germanium, oxygen, or fluorine, and use is more preferably made of boron, aluminum, gallium, indium, nitrogen, phosphorus, arsenic, or antimony.

Examples of the dopant substance include boron trifluoride, boron trichloride, boron tribromide, trimethyl boronate, diborane, aluminum trichloride, gallium trichloride, indium trichloride, ammonia, nitrous oxide, nitrogen, phosphine, phosphorus trifluoride, phosphorus pentafluoride, phosphoryl chloride, diphosphorus pentaoxide, phosphoric acid, arsine, arsenic trifluoride, antimony pentachloride, carbon tetrachloride, monosilane, disilane, trisilane, dichlorosilane, trichlorosilane, silicon tetrafluoride, silicon tetrachloride, germane, tin tetrachloride, oxygen, hydrogen sulfide, hydrogen selenide, hydrogen telluride, hydrogen fluoride, fluorocarbon, fluorine, chlorine trifluoride, hydrogen chloride, chlorine, hydrogen bromide, bromine, hydrogen iodide, iodine, cadmium dichloride, zinc dichloride, titanium tetrachloride, tungsten hexafluoride, and iron trichloride.

In the method for manufacturing a semiconductor element according to the present invention, it is preferred that, in the ion doping step, a substrate is exposed to the compound containing the element to form an ion impurity region, and heated. The ion doping temperature in the ion doping step is typically from 10 to 1,500° C., preferably 100° C. or higher, more preferably 200° C. or higher. When the ion doping temperature is in the above-mentioned range, the element to form an ion impurity region easily diffuses into a substrate.

In the method for manufacturing a semiconductor element according to the present invention, the ion doping time in the ion doping step is preferably 1 minute or longer, more preferably 5 minutes or longer, still more preferably 10 minutes or longer, particularly preferably 30 minutes or longer. When the ion doping time is in the above-mentioned range, the element to form an ion impurity region easily diffuses into a substrate. On the other hand, from the viewpoint of takt time, the ion doping time is preferably 300 minutes or shorter, more preferably 240 minutes or shorter, still more preferably 180 minutes or shorter, particularly preferably 120 minutes or shorter.

In the method for manufacturing a semiconductor element according to the present invention, it is preferred in the ion implantation step to apply a bias to ions, thereby accelerating the ions and causing the ions to collide with a substrate. In the ion implantation step, energy for accelerating ions is typically from 1 to 10,000 keV. From the viewpoint of ion implantation depth into a substrate, the energy is preferably from 1 to 5,000 keV, more preferably from 5 to 1,000 keV, still more preferably from 10 to 500 keV.

In the method for manufacturing a semiconductor element according to the present invention, the dose of ions in the ion implantation step is typically from $1 \times 10^{10}$ to $1 \times 10^{22}$ cm$^{-2}$. From the viewpoint of prevention of damage to the crystal structure of a substrate and ion implantation depth into the substrate, the dose is preferably from $1 \times 10^{10}$ to $1 \times 10^{20}$ cm$^{-2}$, more preferably from $1 \times 10^{11}$ to $1 \times 10^{19}$ cm$^{-2}$.

(Step of Etching Substrate)

Using a pattern formed from the resin composition according to the present invention as a mask, a substrate having a pattern formed thereon is dry-etched or wet-etched, so that the substrate can be patterned.

Examples of etching gas include fluoromethane, difluoromethane, trifluoromethane, tetrafluoromethane, chlorofluoromethane, chlorodifluoromethane, chlorotrifluoromethane, dichlorofluoromethane, dichlorodifluoromethane, trichlorofluoromethane, sulfur hexafluoride, xenon difluoride, oxygen, ozone, argon, fluorine, chlorine, and boron trichloride.

Examples of a method for the dry etching include reactive gas etching in which a substrate having a resin film pattern formed from the resin composition according to the present invention thereon is exposed to the above-mentioned etching gas; plasma etching in which such a substrate is exposed to the etching gas ionized or radicalized by electromagnetic waves; and reactive ion etching in which a bias is applied to the etching gas ionized or radicalized by electromagnetic waves to accelerate the gas and cause the gas to collide with a substrate having a pattern of a polysiloxane-containing composition formed thereon.

In the method for manufacturing a semiconductor device according to the present invention, the etching temperature in the step of dry-etching a substrate is preferably from 10 to 400° C., more preferably from 20 to 350° C., still more preferably from 30 to 300° C., particularly preferably from 40 to 250° C. When the etching temperature is in the above-mentioned range, the etching rate can be improved.

In the method for manufacturing a semiconductor device according to the present invention, the etching time in the step of dry-etching a substrate is preferably 10 seconds or longer, more preferably 30 seconds or longer, still more preferably 1 minute or longer, particularly preferably 3 minutes or longer, most preferably 5 minutes or longer. On the other hand, from the viewpoint of takt time, the etching time is preferably 60 minutes or shorter, more preferably 45 minutes or shorter, still more preferably 30 minutes or shorter, particularly preferably 15 minutes or shorter.

As an etchant, an acidic or alkaline chemical liquid may be employed.

Examples of the acidic etchant include solutions of acidic compounds, such as hydrofluoric acid, hydrochloric acid, hydrobromic acid, hydroiodic acid, perchloric acid, chloric acid, chlorous acid, hypochlorous acid, perbromic acid, bromic acid, bromous acid, hypobromous acid, periodic acid, iodic acid, iodous acid, hypoiodous acid, sulfuric acid, sulfurous acid, hyposulfurous acid, nitric acid, nitrous acid, phosphoric acid, phosphorous acid, hypophosphorous acid, phosphonic acid, phosphinic acid, hexafluorophosphoric acid, hexafluoroantimonic acid, boric acid, tetrafluoroboric acid, formic acid, acetic acid, propionic acid, butanoic acid, trifluoroacetic acid, oxalic acid, lactic acid, methanesulfonic acid, p-toluene sulfonic acid, trifluoromethane sulfonic acid, and fluorosulfonic acid.

The alkaline etchant is preferably an organic alkaline solution or an aqueous solution of an alkaline compound.

Examples of the organic alkaline solution or the alkaline compound include 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethylammonium hydroxide, tetraethylammonium hydroxide, sodium hydroxide, potassium hydroxide, magnesium hydroxide, calcium hydroxide, barium hydroxide, sodium carbonate, and potassium carbonate.

As the etchant, a mixed solution containing both of an alkaline etchant and an organic solvent may be employed.

Examples of the organic solvent include the above-mentioned solvents, diethylene glycol mono-n-butyl ether, ethyl acetate, ethyl pyruvate, ethyl 3-methoxypropionate, ethyl 3-ethoxypropionate, N-acetyl-2-pyrrolidone, dimethylsulfoxide, hexamethylphosphoric triamide, methanol, ethanol, isopropyl alcohol, toluene, and xylene.

Examples of a method for the wet etching include a method of applying the above-mentioned etchant as it is or spraying the etchant in the form of a mist, onto a substrate having a resin film pattern according to the present invention formed thereon; a method of immersing, into the above-mentioned etchant, a substrate having a pattern of a polysiloxane-containing composition formed thereon; and a method of immersing, into the above-mentioned etchant, a substrate having a pattern of a polysiloxane-containing composition formed thereon, and then irradiating ultrasonic waves on the substrate.

In the method for manufacturing a semiconductor device according to the present invention, the etching temperature in the step of wet-etching a substrate is preferably from 10 to 180° C., more preferably from 20 to 160° C., still more preferably from 30 to 140° C., particularly preferably from 40 to 120° C. When the etching temperature is in the above-mentioned range, the etching rate can be improved. When the boiling point of a component in an etchant is lower than 180° C., the etching temperature is preferably lower than the boiling point of the component in the etchant.

In the method for manufacturing a semiconductor device according to the present invention, the etching time in the step of wet-etching a substrate is preferably 10 seconds or longer, more preferably 30 seconds or longer, still more preferably 1 minute or longer, particularly preferably 3 minutes or longer, most preferably 5 minutes or longer. On the other hand, from the viewpoint of takt time, the etching time is preferably 60 minutes or shorter, more preferably 45 minutes or shorter, still more preferably 30 minutes or shorter, particularly preferably 15 minutes or shorter.

After the wet etching, a substrate patterned by the wet etching is preferably washed with a rinsing liquid.

Examples of the rinsing liquid include water, methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, and 2-heptanone. In the case where an acidic etchant or an aqueous solution of an alkaline compound is used as the etchant, a rinsing liquid containing water is preferably employed.

Ion milling is a sort of dry etching step, specifically, a step of milling a substrate to form a pattern by making use of sputtering in which the substrate is irradiated with non-converging broad argon ion beams to sputter atoms of the substrate.

In the ion milling, using the resin film pattern according to the present invention as an ion milling mask, the substrate having the pattern formed thereon is ion-milled, whereby the substrate can be patterned. Ion milling is a sort of dry etching step, specifically, a step of milling a substrate to form a pattern by making use of sputtering in which the substrate is irradiated with non-converging broad argon ion beams to sputter atoms of the substrate. The irradiation of argon ions is preferably performed at 1 to 20 kV and at an incidence angle of 50 to 20°. The processing time and temperature are the same as those in the above-mentioned dry etching.

A semiconductor element manufactured by making use of the method for manufacturing a semiconductor element according to the present invention has the advantages that a process for manufacturing a semiconductor is simplified, thereby leading to decreases in costs. Furthermore, a semiconductor device including the semiconductor element according to the present invention also has the advantage of lower costs.

Examples of a semiconductor device to which the method for manufacturing a semiconductor device according to the present invention is applicable include, but are not limited to, semiconductor elements, such as Schottky diodes, Schottky barrier diodes (SBD), pn junction diodes, PIN diodes, thyristors, gate turn-off thyristors (GTO), bipolar transistors, metal oxide semiconductor field-effect transistors (MOSFET), insulated gate bipolar transistors (IGBT), and light emitting diodes; and power conditioners for photovoltaic power generation, vehicle-mounted power control units, inverters for photovoltaic power generation, switching power sources, inverters, converters, and optical elements, each having at least one of the above-mentioned semiconductor elements.

EXAMPLES

Hereinafter, the present invention will be described by way of examples, but the present invention is not limited to these examples.

First, evaluation methods in Examples and Comparative Examples will be described. For the evaluations, a resin composition (hereinafter referred to as a varnish) that had been filtered in advance with a 1 μm polytetrafluoroethylene filter (manufactured by Sumitomo Electric Industries, Ltd.) was used.

(1) Sensitivity Evaluation

Using a coating and developing apparatus ACT-8 (manufactured by Tokyo Electron Limited), a varnish was applied onto an 8 inch silicon wafer by spin coating, and the coated wafer was prebaked at 120° C. for 3 minutes. Using an exposure apparatus i-line stepper NSR-2005i9C (manufactured by NIKON CORPORATION), exposure was performed. After the exposure, using the developing device of ACT-8, development was repeated twice using 2.38% by weight of a tetramethylammonium hydroxide aqueous solution (hereinafter, referred to as TMAH, manufactured by Tama Chemicals Co., Ltd.) by a puddling method, in which the ejection time of the developing solution was 10 seconds and the puddling time was 40 seconds. Subsequently, rinsing was performed with pure water, followed by shaking off and drying. The minimum light exposure at the time when an exposed portion was completely dissolved was regarded as sensitivity. A sensitivity of 500 mJ/cm$^2$ or higher was rated as poor (x); a sensitivity of 300 mJ/cm$^2$ or higher and less than 500 mJ/cm$^2$ was rated as good (B); and a sensitivity of less than 300 mJ/cm$^2$ was rated as excellent (A)

(2) Resolution Evaluation

Using a coating and developing apparatus ACT-8, a varnish was applied onto an 8 inch silicon wafer by spin coating, and the coated wafer was prebaked at 120° C. for 3 minutes. A reticle having a cutout pattern was set in an exposure apparatus i-line stepper NSR-2005i9C (manufactured by NIKON CORPORATION) and the coated wafer was exposed at an exposure dose of 800 mJ/cm$^2$. After the exposure, using the developing device of ACT-8, development was repeated twice using 2.38% by weight of TMAH by a puddling method, in which the ejection time of the developing solution was 10 seconds and the puddling time was 40 seconds. Subsequently, rinsing was performed with pure water, followed by shaking off and drying to obtain a resin film pattern. Using an inert oven CLH-21CD-S (manufactured by Koyo Thermo Systems Co., Ltd.), the temperature was raised to 200° C. at a temperature rise rate of 3.5° C. per minute at an oxygen concentration of 20 ppm or less under nitrogen flow, and heat treatment was performed at 200° C. for 1 hour. At the time when the temperature reached 50° C. or lower, the wafer was taken out and the pattern was observed by a microscope. As a result, a minimum dimension at which lines and spaces were resolved was regarded as resolution. A resolution of 10 µm or more was rated as poor (C); a resolution of 5 µm or more and less than 10 µm was rated as good (B); and a resolution of less than 5 µm was rated as excellent (A).

By cross-section observation using a scanning electron microscope (SEM), the shape (taper angle) of a pattern was observed. A rectangular shape (a taper angle of 90°) is preferred. A taper angle of less than 70° was rated as poor (C); a taper angle of 70° or more and less than 80° was rated as good (B); and a taper angle of 80° or more and 90° or less was rated as excellent (A)

(3) Reworkability Evaluation

Using an inert oven INH-21CD, the temperature was raised to 200° C. at a temperature rise rate of 3.5° C. per minute at an oxygen concentration of 20 ppm or less under nitrogen flow, a silicon wafer having been patterned in (1) was heat-treated at 250° C. for 1 hour. At the time when the temperature reached 50° C. or lower, the wafer was taken out to produce a resin coating. The obtained resin coating was immersed in release liquid 106 (manufactured by TOKYO OHKA KOGYO CO., LTD.) to undergo a treatment at 70° C. for 10 minutes, and then washed with water. The surface of the wafer was observed with an optical microscope, and the case where the pattern was not dissolved at all was rated as unsatisfactory (C); the case where although residues remained in the surface of the wafer, the pattern was dissolved was rated as good (B); and the case where the pattern was dissolved without residues in the surface of the wafer was rated as excellent (A).

Synthesis Example 1: Synthesis of Photosensitizer

Under dry nitrogen flow, 21.22 g (0.05 mol) of TrisP-PA (trade name, manufactured by Honshu Chemical Industry Co., Ltd.) and 26.8 g (0.1 mol) of 5-naphthoquinone diazide sulfonic acid chloride (NAC-5, manufactured by Toyo Gosei Co., Ltd.) were dissolved in 450 g of 1,4-dioxane, and the resulting solution was allowed to reach room temperature. To the solution, a mixture of 50 g of 1,4-dioxane and 12.65 g of triethylamine was added dropwise so that the temperature in the system did not reach 35° C. or higher. After the dropwise addition, the resulting mixture was stirred at 40° C. for 2 hours. Triethylamine salts were filtered off and the resulting filtrate was poured into water. Subsequently, the resulting precipitate was collected by filtration and washed with 1 L of 1% aqueous hydrochloric acid. Subsequently, the precipitate was further washed twice with 2 L of water. This precipitate was dried in a vacuum dryer to obtain a quinone diazide compound (photosensitizer B) of the following formula.

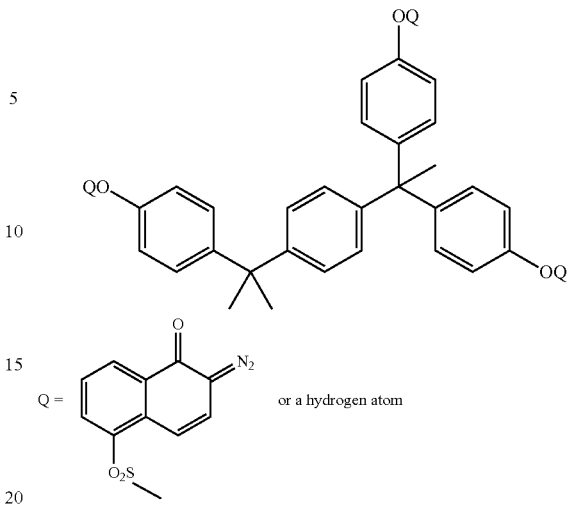

Synthesis Example 2: Synthesis of Polyhydroxystyrene Resin (A0-1)

To a mixed solution of 500 mL of tetrahydrofuran and 0.01 mol of sec-butyllithium serving as an initiator, a total of 20 g of p-t-butoxystyrene and styrene at a molar ratio of p-t-butoxystyrene to styrene of 3:1 were added, and the resulting mixture was polymerized while being stirred for 3 hours. The polymerization was terminated by adding 0.1 mol of methanol to the reaction solution. Next, the reaction mixture was poured into methanol for polymer purification, and the precipitated polymer was dried to obtain a white polymer. Furthermore, the white polymer was dissolved in 400 mL of acetone, and a small amount of concentrated hydrochloric acid was added thereto at 60° C. After being stirred for 7 hours, the mixture was poured into water to precipitate a polymer and deprotect p-t-butoxystyrene to be converted into p-hydroxystyrene, and washed and dried, yielding a purified copolymer (hereinafter, referred to as (A0-1)) of p-hydroxystyrene and styrene. According to GPC analysis, the copolymer had a weight-average molecular weight (Mw) of 3,500 (in terms of GPC polystyrene) and a dispersion (Mw/Mn) of 2.80.

Synthesis Example 3: Synthesis of Polyhydroxystyrene Resin (A0-2)

The synthesis was performed in the same manner as in the above-mentioned Synthesis Example 2, except that m-t-butoxystyrene was used in place of p-t-butoxystyrene used in Synthesis Example 2. According to GPC analysis, the obtained copolymer (hereinafter, referred to as (A0-2)) of m-hydroxystyrene and styrene had a weight-average molecular weight (Mw) of 5,000 (in terms of GPC polystyrene) and a dispersion (Mw/Mn) of 3.20.

Synthesis Example 4: Synthesis of Alkali-soluble Resin (A1-1)

The poly hydroxystyrene resin (A0-1) was dissolved in a solution prepared by dissolving 80 g (2.0 mol) of sodium hydroxide in 800 g of pure water. After the resin was completely dissolved, 686 g of a 36% to 38% by weight formalin aqueous solution was added dropwise at 20 to 25° C. for 2 hours. Subsequently, the mixture was stirred at 20 to 25° C. for 17 hours. To the resulting solution, 98 g of sulfuric acid and 552 g of water were added to perform neutralization, and allowed to stand for 2 days. A white solid produced in the solution after the solution had been allowed to stand was washed with 100 mL of water. This white solid was vacuum-dried at 50° C. for 48 hours.

Next, the thus-obtained compound was dissolved in 300 mL of methanol, and 2 g of sulfuric acid was added thereto, followed by stirring at room temperature for 24 hours. To this solution, 15 g of an anionic ion exchange resin (Amberlyst IRA96SB, manufactured by Rohm and Haas) were added, followed by stirring for 1 hour, and the ion exchange resin was removed therefrom by filtration. Subsequently, to the resulting solution, 500 mL of gamma butyrolactone was added, and methanol was removed off by a rotary evaporator, so that a gamma butyrolactone solution was obtained. An analysis of this resin by NMR (GX-270, manufactured by JEOL Ltd.) revealed that an alkali-soluble resin (hereinafter, referred to as (A1-1)) as a polyhydroxystyrene resin in which a part of aromatic hydrogen was methylolized was obtained. According to GPC analysis, the obtained resin had a weight-average molecular weight (Mw) of 8,000 (in terms of GPC polystyrene), and the introduction ratio of the methylolized hydroxystyrene was 35 mol % per 1 mol of hydroxystyrene.

Synthesis Example 5: Synthesis of Alkali-soluble Resin (A1-2)

The synthesis was performed in the same manner as in the above-mentioned Synthesis Example 4, except that the resin (A0-2) was used in place of the resin (A0-1) used in Synthesis Example 5. The obtained alkali-soluble resin (hereinafter, referred to as (A1-2)) that was a methylolized polyhydroxystyrene resin had a weight-average molecular weight (Mw) of 7,500 (in terms of GPC polystyrene), and the introduction ratio of the methylolized hydroxystyrene was 55 mol % per 1 mol of hydroxystyrene.

Synthesis Example 6: Synthesis of Alkali-Soluble Polyimide Resin (A2-1)

Under dry nitrogen flow, 31.13 g (0.085 mol) of 2,2-bis (3-amino-4-hydroxyphenyl)hexafluoropropane (hereinafter, referred to as BAHF) and 3.27 g (0.03 mol) of 3-aminophenol (hereinafter, referred to as MAP) as a terminal blocking agent were dissolved in 80 g of N-methylpyrrolidone (NMP). To the resulting solution, 31.2 g (0.1 mol) of 3,3',4,4'-diphenyl ether tetracarboxylic dianhydride (hereinafter, referred to as ODPA) and 20 g of NMP were added, and the mixture was allowed to react at 20° C. for 1 hour and then allowed to react at 50° C. for 4 hours. Subsequently, 15 g of xylene was added to the resulting solution, and, while water was subjected to azeotropy with xylene, the mixture was stirred at 150° C. for 5 hours. After completion of the stirring, the solution was poured into 3 L of water to obtain a white precipitate. This precipitate was collected by filtration, and washed three times with water, and then dried in a vacuum dryer at 80° C. for 20 hours, yielding a polyimide resin (hereinafter, referred to as (A2-1)) that was an alkali-soluble resin having a phenolic hydroxy group. The resin (A2-1) had a weight-average molecular weight of 25,000 and an imidization ratio of 92%.

Synthesis Example 7: Synthesis of Alkali-Soluble Polyimide Resin (A2-2)

Under dry nitrogen flow, 23.83 g (0.065 mol) of BAHF, 8.00 g (0.02 mol) of D-400 (manufactured by HUNTSMAN Corporation), and 3.27 g (0.03 mol) of 4-aminophenol (manufactured by Tokyo Chemical Industry Co., Ltd.) as a terminal blocking agent were dissolved in 80 g of NMP. To the resulting solution, 31.2 g (0.1 mol) of ODPA and 20 g of NMP were added, and the mixture was allowed to react at 60° C. for 1 hour, and then stirred at 180° C. for 4 hours. After completion of the stirring, the solution was poured into 3 L of water to obtain a white precipitate. This precipitate was collected by filtration, and washed three times with water, and then dried in a vacuum dryer at 80° C. for 20 hours, yielding an alkali-soluble polyimide resin (A2-2) in powder form. The resin (A2-2) had a weight-average molecular weight of 23,000 and an imidization ratio of 90%.

Synthesis Example 8: Synthesis of Alkali-Soluble Polyimide Resin (A2-3)

Under dry nitrogen flow, 23.83 g (0.065 mol) of BAHF, 12.00 g (0.02 mol) of ED-600 (manufactured by HUNTSMAN Corporation), and 3.27 g (0.03 mol) of 4-aminophenol (manufactured by Tokyo Chemical Industry Co., Ltd.) as a terminal blocking agent were dissolved in 80 g of NMP. To the resulting solution, 31.2 g (0.1 mol) of ODPA and 20 g of NMP were added, and the mixture was allowed to react at 60° C. for 1 hour, and then stirred at 180° C. for 4 hours. After completion of the stirring, the solution was poured into 3 L of water to obtain a white precipitate. This precipitate was collected by filtration, and washed three times with water, and then dried in a vacuum dryer at 80° C. for 20 hours, yielding an alkali-soluble polyimide resin (A2-3) in powder form. The resin (A2-3) had a weight-average molecular weight of 26,000 and an imidization ratio of 95%.

Synthesis Example 9: Synthesis of Alkali-Soluble Polyimide Resin (A2-4)

Under dry nitrogen flow, 23.83 g (0.065 mol) of BAHF, 18.00 g (0.02 mol) of ED-900 (manufactured by HUNTSMAN Corporation), and 3.27 g (0.03 mol) of 4-aminophenol (manufactured by Tokyo Chemical Industry Co., Ltd.) as a terminal blocking agent were dissolved in 80 g of NMP. To the resulting solution, 31.2 g (0.1 mol) of ODPA and 20 g of NMP were added, and the mixture was allowed to react at 60° C. for 1 hour, and then stirred at 180° C. for 4 hours. After completion of the stirring, the solution was poured into 3 L of water to obtain a white precipitate. This precipitate was collected by filtration, and washed three times with water, and then dried in a vacuum dryer at 80° C. for 20 hours, yielding an alkali-soluble polyimide resin (A2-4) in powder form. The resin (A2-4) had a weight-average molecular weight of 25,000 and an imidization ratio of 89%.

Synthesis Example 10: Synthesis of Alkali-Soluble Polyimide Resin (A2-5)

Under dry nitrogen flow, 23.83 g (0.065 mol) of BAHF, 18.00 g (0.02 mol) of ED-900 (manufactured by HUNTSMAN Corporation), and 3.27 g (0.03 mol) of 4-aminophenol (manufactured by Tokyo Chemical Industry Co., Ltd.) as a terminal blocking agent were dissolved in 80 g of NMP. To the resulting solution, 17.68 g (0.04 mol) of 4,4'-(hexafluoroisopropylidene)diphthalic dianhydride (6FDA), 18.72 g (0.06 mol) of ODPA, and 20 g of NMP were added, and the mixture was allowed to react at 60° C. for 1 hour and, then stirred at 180° C. for 4 hours. After completion of the stirring, the solution was poured into 3 L of water to obtain a white precipitate. This precipitate was collected by filtration, and washed three times with water, and then dried in a vacuum dryer at 80° C. for 20 hours, yielding an alkali-soluble polyimide resin (A2-5) in powder form. The resin (A2-5) had a weight-average molecular weight of 28,000 and an imidization ratio of 93%.

Synthesis Example 11: Synthesis of Polyimide Resin (A2-6)

Under dry nitrogen flow, 18.0 g (0.09 mol) of DAE was dissolved in 80 g of NMP. To the resulting solution, 31.2 g (0.1 mol) of ODPA and 20 g of NMP were added, and the mixture was allowed to react at 20° C. for 1 hour and then allowed to react at 50° C. for 4 hours. Furthermore, subsequently, the resulting solution was stirred at 180° C. for 5 hours. After completion of the stirring, the solution was poured into 3 L of water to obtain a white precipitate. This precipitate was collected by filtration, and washed three times with water, and then dried in a vacuum dryer at 80° C. for 20 hours, yielding a polyimide resin (hereinafter, referred to as (A2-6)) not having a substituent that reacts with a reactive group of the resin (A1).

Examples 1 to 14 and Comparative Examples 1 to 4

The components were mixed at weight ratios shown in Table 1 below, and then, to each of the resulting mixtures, a solvent was added to prepare a varnish having a solid concentration of 40%. The properties of such varnishes were measured by the above-mentioned evaluation methods. Table 2 shows the obtained results.

Example 15

Using a coating and developing apparatus ACT-8, the varnish of Example 10 was applied in 7 µm thickness onto a 5-µm-thick aluminum film formed on an 8 inch silicon wafer by spin coating, and the coated wafer was prebaked at 120° C. for 3 minutes. A reticle having a cutout pattern was set in an exposure apparatus i-line stepper NSR-2005i9C (manufactured by NIKON CORPORATION) and the coated wafer was exposed at an exposure dose of 500 mJ/cm². After the exposure, using the developing device of ACT-8, development was repeated twice using 2.38% by weight of TMAH by a puddling method, in which the ejection time of a developing solution was 10 seconds and the puddling time was 40 seconds. Subsequently, rinsing was performed with pure water, followed by shaking off and drying to obtain a resin film pattern. Using an inert oven CLH-21CD-S (manufactured by Koyo Thermo Systems Co., Ltd.), the temperature was raised to 200° C. at a temperature rise rate of 3.5° C. per minute at an oxygen concentration of 20 ppm or less under nitrogen flow, and heat treatment was performed at 200° C. for 1 hour. At the time when the temperature reached 50° C. or lower, the wafer was taken out. Subsequently, using RIE-200iP (manufactured by Samco Inc.), dry etching was performed under the conditions of 0.5 Pa, 400 W, and $Cl_2/BCl_3=10/45$ sccm, followed by washing with water for 5 minutes. At this time, the temperature of the substrate reached 210° C., but, peeling, cracking, blistering, and the like did not occur in the resin film. Subsequently, the wafer was treated for 10 minutes in a solution having a temperature of 80° C. and a weight ratio of dimethyl sulfoxide/monoethanolamine=3/7 to dissolve and peel off the resin film pattern. As a result, 3 µm minute resolution was observed in the 5-µm-thick aluminum film.

Example 16

The varnish of Example 10 was applied in 3 µm thickness onto a 4 inch SiC wafer by spin coating, and the coated wafer was prebaked at 120° C. for 3 minutes. A reticle having a cutout pattern was set in an exposure apparatus i-line stepper NSR-2005i9C (manufactured by NIKON CORPORATION), and the coated wafer was exposed at an exposure dose of 500 mJ/cm². After the exposure, using an automatic developing apparatus, development was repeated twice using 2.38% by weight of TMAH by a puddling method, in which the ejection time of a developing solution was 10 seconds and the puddling time was 40 seconds. Subsequently, rinsing was performed with pure water, followed by shaking off and drying to obtain a resin film pattern. Using an inert oven CLH-21CD-S (manufactured by Koyo Thermo Systems Co., Ltd.), the temperature was raised to 250° C. at a temperature rise rate of 3.5° C. per minute at an oxygen concentration of 20 ppm or less under nitrogen flow, and heat treatment was performed at 250° C. for 1 hour. At the time when the temperature reached 50° C. or lower, the wafer was taken out. Subsequently, ion implantation was performed using an ion implantation apparatus (manufactured by Nissin Ion Equipment Co., Ltd.). The ion implantation was performed under the conditions of ion-implantation temperature: 250° C., ion implantation energy: 300 keV, ion dose: $1\times10^{13}$ cm$^{-2}$, ion species: aluminum, and current value: 500 µA. After the ion implantation, it was observed that peeling, cracking, blistering, and the like did not occur in the resin film. Subsequently, the wafer was treated for 10 minutes in a solution having a temperature of 80° C. and a weight ratio of dimethyl-sulfoxide/monoethanolamine=3/7 to dissolve and peel off the resin film pattern. As a result, it was confirmed that Al ions were implanted into SiC at 2-µm resolution.

Example 17

The varnish of Example 10 was applied in 3 µm thickness onto a 4 inch SiC wafer by spin coating, and the coated wafer was prebaked at 120° C. for 3 minutes. A reticle having a cutout pattern was set in an exposure apparatus i-line stepper NSR-2005i9C (manufactured by NIKON CORPORATION), and the wafer was exposed at an exposure dose of 500 mJ/cm². After the exposure, using an automatic developing apparatus, development was repeated twice using 2.38% by weight of TMAH by a puddling method, in which the ejection time of a developing solution was 10 seconds and the puddling time was 40 seconds. Subsequently, rinsing was performed with pure water, followed by shaking off and drying to obtain a resin film pattern. Using an inert oven CLH-21CD-S (manufactured by Koyo Thermo Systems Co., Ltd.), the temperature was raised to 250° C. at a temperature rise rate of 3.5° C. per minute at an oxygen concentration of 20 ppm or less under nitrogen flow, and heat treatment was performed at 250° C. for 1 hour. At the time when the temperature reached 50° C. or lower, the wafer was taken out. Subsequently, using an ion milling apparatus (IB-09020CP, manufactured by JEOL Ltd.), ion milling was performed under the conditions of ion accelerating voltage: 4 kV, ion beam diameter: 500 µm (full width at half maximum), and milling speed: 100 µm/H. After the ion milling, it was observed that peeling, cracking, blistering, and the like did not occur in the resin film.

Subsequently, the wafer was treated for 10 minutes in a solution having a temperature of 80° C. and a weight ratio of dimethyl-sulfoxide/monoethanolamine=3/7 to dissolve and peel off the resin film pattern. As a result, it was confirmed that grooves were formed in the Si wafer at 2-μm resolution.

TABLE 1

| | Component (A1) Addition Amount | Component (A2) | Component (d) Addition Amount | Component (B) Addition Amount | Solvent |
|---|---|---|---|---|---|
| Example 1 | (A1-1) 100 parts by weight | (A2-1) 400 parts by weight | — | (B) 20 parts by weight | γ-butyrolactone |
| Example 2 | (A1-1) 100 parts by weight | (A2-2) 400 parts by weight | — | (B) 20 parts by weight | γ-butyrolactone |
| Example 3 | (A1-1) 100 parts by weight | (A2-3) 480 parts by weight | — | (B) 20 parts by weight | γ-butyrolactone |
| Example 4 | (A1-1) 100 parts by weight | (A2-4) 400 parts by weight | — | (B) 20 parts by weight | γ-butyrolactone |
| Example 5 | (A1-1) 100 parts by weight | (A2-5) 400 parts by weight | — | (B) 20 parts by weight | γ-butyrolactone |
| Example 6 | (A1-1) 100 parts by weight | (A2-1) 350 parts by weight | — | (B) 20 parts by weight | γ-butyrolactone |
| Example 7 | (A1-2) 100 parts by weight | (A2-1) 1000 parts by weight | — | (B) 20 parts by weight | γ-butyrolactone |
| Example 8 | (A1-2) 100 parts by weight | (A2-1) 2000 parts by weight | — | (B) 20 parts by weight | γ-butyrolactone |
| Example 9 | (A1-2) 100 parts by weight | (A2-1) 400 parts by weight | NIKALAC MW-100LM 1 part by weight | (B) 20 parts by weight | γ-butyrolactone |
| Example 10 | (A1-1) 100 parts by weight | (A2-1) 400 parts by weight | NIKALAC MW-100LM 1 part by weight | (B) 20 parts by weight | γ-butyrolactone |
| Example 11 | (A1-1) 100 parts by weight | (A2-1) 1000 parts by weight | NIKALAC MW-100LM 1 part by weight | (B) 20 parts by weight | γ-butyrolactone |
| Example 12 | (A1-1) 100 parts by weight | (A2-1) 2000 parts by weight | NIKALAC MW-100LM 1 part by weight | (B) 20 parts by weight | γ-butyrolactone |
| Example 13 | (A1-1) 100 parts by weight | (A2-1) 310 parts by weight | NIKALAC MW-100LM 1 part by weight | (B) 20 parts by weight | γ-butyrolactone |
| Example 14 | (A1-1) 100 parts by weight | (A2-1) 350 parts by weight | NIKALAC MW-100LM 1 part by weight | (B) 20 parts by weight | γ-butyrolactone |
| Comparative Example 1 | (A1-1) 100 parts by weight | (A2-6) 300 parts by weight | — | (B) 20 parts by weight | γ-butyrolactone |
| Comparative Example 2 | (a1-3) 100 parts by weight | (A2-1) 100 parts by weight | — | (B) 20 parts by weight | γ-butyrolactone |
| Comparative Example 3 | (A1-1) 100 parts by weight | (A2-1) 300 parts by weight | — | (B) 20 parts by weight | γ-butyrolactone |
| Comparative Example 4 | (A1-1) 100 parts by weight | (A2-1) 2500 parts by weight | — | (B) 20 parts by weight | γ-butyrolactone |

TABLE 2

| | Sensitivity Evaluation | | Resolution Evaluation | | | | Reworkability Evaluation |
|---|---|---|---|---|---|---|---|
| | Sensitivity | | Minimum Resolution | | Taper Angle Evaluation | | |
| | (mJ/cm$^2$) | Rating | Dimension (μm) | Rating | Taper Angle (°) | Rating | Rating |
| Example 1 | 250 | A | 3 | A | 90 | A | A |
| Example 2 | 200 | A | 3 | A | 90 | A | A |
| Example 3 | 200 | A | 3 | A | 90 | A | A |
| Example 4 | 200 | A | 3 | A | 90 | A | A |
| Example 5 | 200 | A | 3 | A | 90 | A | A |
| Example 6 | 250 | A | 3 | A | 90 | A | A |
| Example 7 | 250 | A | 3 | A | 85 | A | A |
| Example 8 | 350 | B | 3 | A | 85 | A | A |
| Example 9 | 150 | A | 2 | A | 90 | A | A |
| Example 10 | 150 | A | 2 | A | 90 | A | A |
| Example 11 | 200 | A | 2 | A | 90 | A | A |
| Example 12 | 300 | A | 2 | A | 90 | A | A |
| Example 13 | 150 | A | 2 | A | 90 | A | B |
| Example 14 | 150 | A | 2 | A | 90 | A | A |

TABLE 2-continued

| | Sensitivity Evaluation | | Resolution Evaluation | | Taper Angle Evaluation | | Reworkability Evaluation |
| --- | --- | --- | --- | --- | --- | --- | --- |
| | Sensitivity (mJ/cm$^2$) | Rating | Minimum Resolution Dimension (μm) | Rating | Taper Angle (°) | Rating | Rating |
| Comparative Example 1 | 750 | C | 12 | C | 60 | C | A |
| Comparative Example 2 | 200 | A | 3 | A | 90 | A | C |
| Comparative Example 3 | 200 | A | 3 | B | 90 | A | C |
| Comparative Example 4 | 1000 | C | 10 | C | 75 | B | A |

The invention claimed is:

1. A resin composition, comprising:
(A1) an alkali-soluble resin having a structural unit represented by general formula (1);
(A2) at least one resin selected from the group consisting of polyimides, polybenzoxazoles, polyamideimides, precursors thereof, and copolymers thereof, the resin having a substituent that reacts with a reactive group of the alkali-soluble resin; and
(B) a photosensitizer, wherein
an amount of the resin (A2) is 350 to 2,000 parts by weight with respect to 100 parts by weight of the resin (A1),

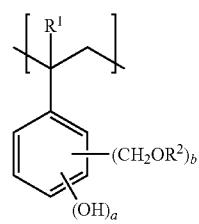

(1)

wherein $R^1$ is a hydrogen atom or a $C_{1-5}$ alkyl group; $R^2$ is a hydrogen atom or a $C_{1-6}$ alkyl group; a is an integer of 0 to 4; b is an integer of 1 to 3; and a+b is an integer of 1 to 5, and
wherein the resin (A2) has at least one of a polyethylene oxide structure and a polypropylene oxide structure.

2. The resin composition according to claim 1, wherein the resin (A2) has at least one of a hexafluoro propylene structure and a propylene structure that are shown below

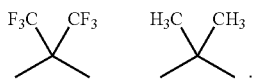

3. The resin composition according to claim 1, further comprising (d) a thermally crosslinkable compound.

4. A photoresist, comprising the resin composition according to claim 1.

5. A resin composition, comprising:
(A1) an alkali-soluble resin having a structural unit represented by general formula (1);
(A2) at least one resin selected from the group consisting of polyimides, polybenzoxazoles, polyamideimides, precursors thereof, and copolymers thereof, the resin having a substituent that reacts with a reactive group of the alkali-soluble resin; and
(B) a photosensitizer, wherein
an amount of the resin (A2) is 350 to 2,000 parts by weight with respect to 100 parts by weight of the resin (A1),
wherein $R^1$ is a hydrogen atom or a $C_{1-5}$ alkyl group; $R^2$ is a hydrogen atom or a $C_{1-6}$ alkyl group; a is an integer of 0 to 4; b is an integer of 1 to 3; and a+b is an integer of 1 to 5, and
wherein the resin composition is soluble in a solution having a weight ratio of dimethyl-sulfoxide/monoethanolamine=3/7 after heat-treated at 250° C. for 1 hour.

6. The resin composition according to claim 5, wherein the resin (A2) has at least one of a hexafluoro propylene structure and a propylene structure that are shown below

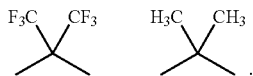

7. The resin composition according to claim 5, further comprising (d) a thermally crosslinkable compound.

8. A photoresist, comprising the resin composition according to claim 5.

9. A method for manufacturing a semiconductor element, the method comprising the steps of:
(1) forming a pattern of a resin composition on a substrate, the resin composition comprising:
(A1) an alkali-soluble resin having a structural unit represented by general formula (1),
(A2) at least one resin selected from the group consisting of polyimides, polybenzoxazoles, polyamideimides, precursors thereof, and copolymers thereof, the resin having a substituent that reacts with a reactive group of the alkali-soluble resin; and
(B) a photosensitizer, wherein an amount of the resin (A2) is 350 to 2,000 parts by weight with respect to 100 parts by weight of the resin (A1),

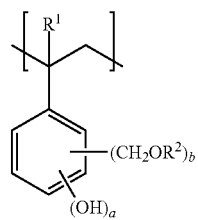

(1)

wherein $R^1$ is a hydrogen atom or a $C_{1-5}$ alkyl group; $R^2$ is a hydrogen atom or a $C_{1-6}$ alkyl group; a is an integer of 0 to 4; b is an integer of 1 to 3; and a+b is an integer of 1 to 5;

(2) performing, at 150° C. or higher, at least one step selected from the group consisting of (a) doping the substrate with impurity ions, (b) etching the substrate, and (c) dry-forming a film on the substrate; and (3) peeling off the pattern.

10. The method for manufacturing a semiconductor element according to claim 9, wherein
the step (a) is
(a-1) a step of implanting ions into the substrate, or
(a-2) a step of exposing, to a dopant, the substrate having the patterned resin film formed thereon.

11. The method for manufacturing a semiconductor element according to claim 9, wherein
the step (b) is
(b-1) a step of patterning the substrate by dry etching, or
(b-2) a step of patterning the substrate by wet etching.

12. The method for manufacturing a semiconductor element according to claim 9, wherein the step (c) is a step of dry-forming a metal film on the substrate.

13. The method for manufacturing a semiconductor element according to claim 9, wherein the substrate includes at least one selected from the group consisting of silicon, silicon dioxide ($SiO_2$), silicon nitride ($Si_3N_4$), silicon carbide (SiC), gallium nitride (GaN), gallium phosphide (GaP), gallium arsenide (GaAs), aluminum gallium arsenide (GaAlAs), gallium indium nitrogen arsenic (GaInNAs), indium nitride (InN), indium phosphide (InP), indium tin oxide (ITO), indium zinc oxide (IZO), indium gallium arsenide (InGaAs), indium gallium aluminum phosphide (InGaAlP), indium gallium zinc oxide (IGZO), diamond, sapphire ($Al_2O_3$), aluminum zinc oxide (AZO), aluminum nitride (AlN), zinc oxide (ZnO), zinc selenide (ZnSe), cadmium sulfide (CdS), cadmium telluride (CdTe), aluminum (Al), and gold (Au).

14. A semiconductor device, comprising a semiconductor element obtained by the method according to claim 9.

* * * * *